(12) United States Patent
Kang et al.

(10) Patent No.: US 9,870,917 B2
(45) Date of Patent: Jan. 16, 2018

(54) VARIABLE TEMPERATURE HARDWARE AND METHODS FOR REDUCTION OF WAFER BACKSIDE DEPOSITION

(71) Applicant: Lam Research Corporation, Fremont, CA (US)

(72) Inventors: Hu Kang, Tualatin, OR (US); Ishtak Karim, Portland, OR (US); Purushottam Kumar, Hillsboro, OR (US); Jun Qian, Sherwood, OR (US); Ramesh Chandrasekharan, Portland, OR (US); Adrien LaVoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/051,886

(22) Filed: Feb. 24, 2016

(65) Prior Publication Data

US 2017/0178898 A1    Jun. 22, 2017

Related U.S. Application Data

(63) Continuation-in-part of application No. 14/972,205, filed on Dec. 17, 2015, now abandoned.

(51) Int. Cl.
*C23C 16/00* (2006.01)
*C23C 16/50* (2006.01)
(Continued)

(52) U.S. Cl.
CPC .. *H01L 21/02274* (2013.01); *H01J 37/32467* (2013.01); *H01J 37/32477* (2013.01); *H01J 37/32715* (2013.01); *H01J 37/32724* (2013.01); *H01L 21/0228* (2013.01); *H01L 21/0262* (2013.01); *H01L 21/68714* (2013.01); *C23C 16/458* (2013.01); *C23C 16/45544* (2013.01);
(Continued)

(58) Field of Classification Search
USPC ................. 118/728–732; 156/345.51–345.55
See application file for complete search history.

(56) References Cited

U.S. PATENT DOCUMENTS

6,143,082 A * 11/2000 McInerney ......... C23C 16/4412
                                                                118/719
6,860,965 B1    3/2005 Stevens
(Continued)

*Primary Examiner* — Karla A Moore
*Assistant Examiner* — Tiffany Z Nuckols
(74) *Attorney, Agent, or Firm* — Buchanan Ingersoll & Rooney PC (57) ABSTRACT

A process tuning kit for use in a chemical deposition apparatus wherein the process tuning kit includes a carrier ring, horseshoes and shims. The horseshoes have the same dimensions and the shims are provided in sets with different thicknesses to control the height of the horseshoes with respect to an upper surface of a pedestal assembly on which the horseshoes and shims are mounted. A semiconductor substrate is transported into a vacuum chamber of the chemical deposition apparatus by the carrier ring which is placed on the horseshoes such that minimum contact area supports lift the substrate from the carrier ring and support the substrate at a predetermined offset with respect to an upper surface of the pedestal assembly. During processing of the substrate, backside deposition can be reduced by using shims of desired thickness to control the predetermined offset.

11 Claims, 7 Drawing Sheets

(51) Int. Cl.
 *C23F 1/00* (2006.01)
 *H01L 21/306* (2006.01)
 *H01L 21/02* (2006.01)
 *H01L 21/687* (2006.01)
 *H01J 37/32* (2006.01)
 *C23C 16/458* (2006.01)
 *C23C 16/455* (2006.01)
 *C23C 16/52* (2006.01)

(52) U.S. Cl.
 CPC ......... *C23C 16/52* (2013.01); *H01J 2237/332* (2013.01)

(56) References Cited

U.S. PATENT DOCUMENTS

| | | |
|---|---|---|
| 8,454,294 B2 | 6/2013 | Gage et al. |
| 8,840,754 B2 | 9/2014 | Hao |
| 8,851,463 B2 | 10/2014 | Angelov et al. |
| 2005/0133165 A1* | 6/2005 | Liu .................... C23C 16/4401 156/345.51 |
| 2010/0218785 A1* | 9/2010 | Green .................... C23C 14/50 134/1.1 |
| 2012/0264051 A1* | 10/2012 | Angelov ............... H01L 21/683 430/256 |
| 2013/0122431 A1 | 5/2013 | Angelov et al. |
| 2016/0172165 A1 | 6/2016 | Jeon et al. |
| 2016/0177444 A1* | 6/2016 | Baldasseroni .... H01J 37/32623 118/728 |

* cited by examiner

VARIABLE TEMPERATURE HARDWARE AND METHODS FOR REDUCTION OF WAFER BACKSIDE DEPOSITION

CROSS REFERENCE TO RELATED APPLICATION

This application is a continuation-in-part of U.S. application Ser. No. 14/972,205, filed on Dec. 17, 2015, the entire contents of which are incorporated herein by reference.

FIELD OF THE INVENTION

This invention pertains to apparatuses and processes for conducting chemical depositions, and for use in conducting plasma enhanced chemical depositions.

BACKGROUND

Plasma processing apparatuses can be used to process semiconductor substrates by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), plasma enhanced pulsed deposition layer (PEPDL) processing, and resist removal. For example, one type of plasma processing apparatus used in plasma processing includes a reaction or deposition chamber containing top and bottom electrodes. A radio frequency (RF) power is applied between the electrodes to excite a process gas or reactor chemistries into a plasma for processing semiconductor substrates in the reaction chamber.

SUMMARY

According to an embodiment, a process tuning kit useful in a chemical deposition apparatus comprises a carrier ring, set of three horseshoes and sets of three shims wherein (a) the shims have an upper surface, a lower surface parallel to the upper surface, an end wall, a U-shaped sidewall extending from the end wall and a bore extending between the upper and lower surfaces, a first set of three shims having the same thickness and a second set of the shims having a different thickness than the first set of shims, (b) the horseshoes have an upper surface, a lower surface parallel to the upper surface, an end wall, a U-shaped side wall extending from the end wall, a bore extending between the upper and lower surfaces, and a slot opening in the end wall and extending less than half way across the upper surface, the bore having the same diameter as the bore of the shims, and/or (c) the carrier ring having an upper surface, a lower surface parallel to the upper surface, an outer side wall, an inner side wall, and three alignment pins extending from the lower surface.

According to another embodiment, a shim of a process tuning kit useful in a chemical deposition apparatus has an upper surface, a lower surface parallel to the upper surface, an end wall, a U-shaped sidewall extending from the end wall and a bore extending between the upper and lower surfaces, and a bore extending between the upper and lower surfaces. The shim preferably has a length of about 0.8 inch, a width of about 0.5 inch, a bore having a diameter of about 0.15 inch, and a thickness of 0.0465 inch, 0.0470 inch, 0.0475 inch, 0.0480 inch, 0.0485 inch, 0.0490 inch, 0.0495 inch, 0.0500 inch, 0.0505 inch, 0.0510 inch, 0.0515 inch, 0.0520 inch, 0.0525 inch, 0.0530 inch, 0.0535 inch, 0.0540 inch, 0.0545 inch, 0.0550 inch, 0.0555 inch, 0.0560 inch, 0.0565 inch, 0.0570 inch, 0.0575 inch, 0.0580 inch, 0.0585 inch, 0.0590 inch, 0.0595 inch, 0.0600 inch, 0.0605 inch, 0.0610 inch, or 0.0615 inch.

According to a further embodiment, a horseshoe of a process tuning kit useful in a chemical deposition apparatus has an upper surface, a lower surface parallel to the upper surface, an end wall, a U-shaped side wall extending from the end wall, a bore extending between the upper and lower surfaces, and a slot opening in the end wall and extending less than half way across the upper surface. The horseshoe preferably has a length of about 0.8 inch, a width of about 0.5 inch, a thickness of about 0.5 inch, the bore having a diameter of about 0.15 inch, the slot having a width of about 0.19 inch and a height of about 0.25 inch, the bore aligned with the slot, the side wall having a pair of parallel straight sections connected by a semicircular section having a radius of about 0.26 inch measured from a center of the bore, the bore having a uniform diameter portion extending about 0.16 inch from the lower surface and a conical portion extending into the upper surface of the horseshoe, the conical portion forming a chamfer with an angle of about 80° and the slot having chamfered edges along the end wall and upper surface.

According to another embodiment, a method of processing a semiconductor substrate in a chemical deposition apparatus comprises (a) transporting the substrate on a carrier ring into a vacuum chamber of the chemical deposition apparatus and placing the carrier ring on a pedestal assembly having a set of horseshoe and shims which support the carrier ring, the horseshoes having bores which receive alignment pins extending from a lower surface of the carrier ring, the substrate being lifted off the carrier ring by minimum contact area supports on the pedestal assembly such that an underside of the substrate is located a predetermined offset distance form an upper surface of the carrier ring, and (b) depositing a layer of material on the substrate while heating the substrate and maintaining the predetermined offset distance such that backside deposition on the substrate is minimized.

BRIEF DESCRIPTION OF THE DRAWING FIGURES

FIGS. 3A-E are views of a carrier ring wherein FIG. 3A is a top view of the carrier ring.

FIGS. 4A-D are views of a horseshoe wherein FIG. 4B is a top view of the horseshoe, FIG. 4C is an end view of the horseshoe.

FIG. 5A-C are views of a shim wherein FIG. 5B is a top view of the shim, and FIG. 5C is an end view of the shim.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, known processes, procedures, and/or components have not been described in detail so as not to unnecessarily obscure aspects of embodiments disclosed herein.

In accordance with an exemplary embodiment, the apparatuses and associated methods disclosed herein can be used for conducting a chemical deposition such as a plasma enhanced chemical deposition (PECVD). The apparatus and methods can be used in conjunction with a semiconductor fabrication based dielectric deposition process that requires separation of self-limiting deposition steps in a multi-step deposition process (for example, atomic layer deposition (ALD), plasma enhanced atomic layer deposition (PEALD), pulsed deposition layer (PDL), or plasma enhanced pulsed deposition layer (PEPDL) processing), however they are not so limited.

As indicated, present embodiments provide apparatus and associated methods for conducting a chemical deposition such as a plasma enhanced chemical vapor deposition. The apparatus and methods are particularly applicable for use in conjunction with semiconductor fabrication based dielectric deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), or plasma enhanced pulsed deposition layer (PEPDL) processing), however they are not so limited. The aforementioned processes can suffer from some drawbacks associated with deposition on the backside of a processed wafer which can lead to wafer curvature as a result of stress on the wafer induced by the backside film deposition.

In chemical deposition processes, a semiconductor substrate such as a wafer can be held on minimum contact area (MCA) pins that are located on a heated pedestal. The wafer or other substrate can be transported on a carrier ring such as a ceramic carrier ring that in addition to holding the wafer also aids in focusing the plasma to the desired area above the wafer. The pedestal may be made of any material that withstands high temperature and is inert to the chemical environments. Metal such as aluminum or ceramic such as aluminum nitride and boron nitride are examples of appropriate materials. To support the wafer and accommodate the carrier ring, the pedestal can have sections of two diameters in which a mesa-shaped section supports the wafer and an annular recess at the periphery of the pedestal allows placement of a carrier ring used to transport the wafer to and from the pedestal. While the MCA pins ensure uniform and fast heating of the wafer, the ratio of front side to back side film deposition can be about 1:1 measured 3 mm from the bevel edge of the wafer.

Figure 1:
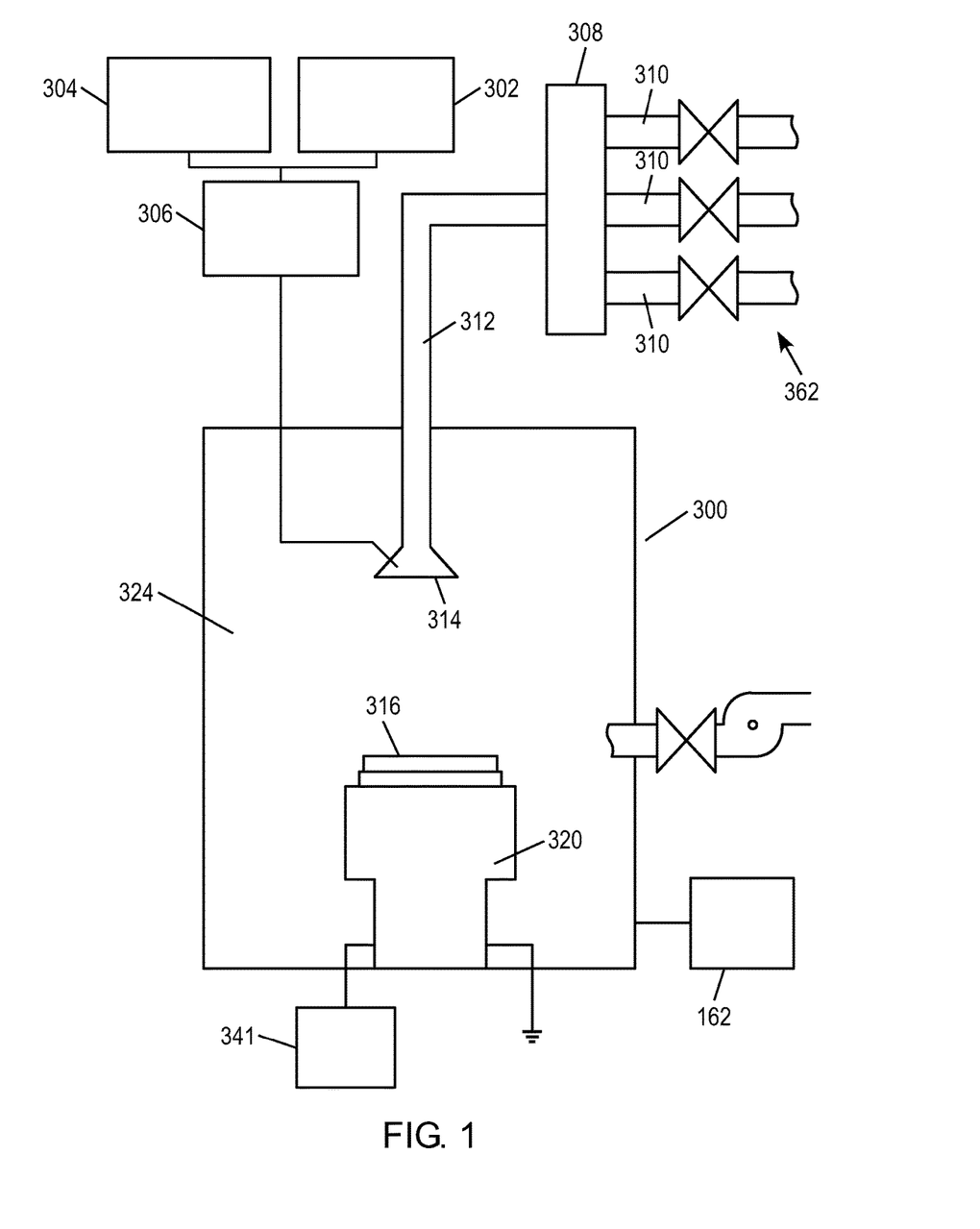
FIG. 1 illustrates a schematic diagram showing a chemical deposition apparatus with a pedestal in accordance with an exemplary embodiment.

Embodiments disclosed herein are preferably implemented in a deposition apparatus such as a plasma-enhanced chemical deposition apparatus (i.e. PECVD apparatus, PEALD apparatus, or PEPDL apparatus), however, they are not so limited. FIG. 1 provides a simple block diagram depicting various substrate plasma processing apparatus components arranged for implementing embodiments as disclosed herein. As shown, a substrate plasma processing apparatus 300 includes a vacuum chamber 324 that serves to contain plasma in a processing zone, which is generated by a capacitor type system including a showerhead assembly 314 optionally having an upper RF electrode (not shown) therein working in conjunction with a substrate pedestal assembly 320 having a lower RF electrode (not shown) therein. At least one RF generator is operable to supply RF energy into a processing zone above an upper surface of a substrate 316 in the vacuum chamber 324 to energize gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead assembly 314 such that RF energy may be supplied to the processing zone above the substrate 316 in the vacuum chamber 324.

The power and frequency of RF energy supplied by matching network 306 to the interior of the vacuum chamber 324 is sufficient to generate plasma from the gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of process gases, may depend on the free volume of the vacuum chamber or processing zone.

An upper surface of the substrate pedestal assembly 320 supports a substrate 316 during processing within the vacuum chamber 324. The substrate pedestal assembly 320 can optionally include a chuck to hold the substrate and/or lift pins to raise and lower the substrate before, during and/or after the deposition and/or plasma treatment processes. In an alternate embodiment, the substrate pedestal assembly 320 can include a carrier ring to raise and lower the substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal assembly including an electrostatic chuck can be found in commonly-assigned U.S. Pat. No. 8,840,754, which is incorporated herein by reference in its entirety. Details of a carrier ring for a substrate pedestal assembly can be found in commonly-assigned U.S. Pat. No. 6,860,965, which is incorporated herein by reference in its entirety. A backside gas supply 341 is operable to supply a heat transfer gas or purge gas through the substrate pedestal assembly 320 to a region below a lower surface of the substrate during processing. The substrate pedestal assembly 320 can include a lower RF electrode therein wherein the lower RF electrode is preferably grounded during processing, however in an alternate embodiment, the lower RF electrode may be supplied with RF energy during processing.

To process a substrate in the vacuum chamber 324 of the substrate plasma processing apparatus 300, gases are introduced from a gas source 362 into the vacuum chamber 324 via inlet 312 and showerhead assembly 314 wherein the gas is formed into plasma with RF energy such that a film may be deposited onto the upper surface of the substrate. In an embodiment, the gas source 362 can include multiple gas lines 310 that are connected to a heated manifold 308. The gases may be premixed or supplied separately to the chamber. Appropriate valving and mass flow control mechanisms are employed to ensure that the correct gases are delivered through the showerhead assembly 314 during substrate processing. During the processing, a backside heat transfer gas or purge gas is optionally supplied to a region below a lower surface of the substrate supported on the substrate pedestal assembly 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc. In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a substrate 316 supported on an upper surface of the substrate pedestal assembly 320 and a plasma exposed surface of the showerhead assembly 314, pressure of the vacuum chamber 324, and other parameters of a particular process. Other computer programs stored on memory devices associated with the controller may be employed in some embodiments. Typically there will be a user interface associated with controller 162. The user interface may include a display screen, graphical software displays of the apparatus and/or process conditions, and user input devices such as pointing devices, keyboards, touch screens, microphones, etc. A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the substrate, pressure of the chamber and other parameters of a particular process. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus. The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

As mentioned above, it would be desirable to reduce backside deposition on the processed wafer. In an exemplary embodiment, the backside deposition can be reduced significantly. For example, when considering a 300 Å film, a process tuning kit (PTK) can be used to reduce the backside deposition to 150 Å or less, preferably 100 Å or less, and more preferably 50 Å or less at 3 mm from the bevel edge. This improved performance is enabled by modifications to the carrier ring and horseshoe set that holds the wafer a desired distance above the carrier ring during processing. However, in an embodiment, the wafer and carrier ring can contact each other during processing.

The PTK includes at least one of a carrier ring, horseshoe and shim of a shim set. In a preferred implementation, the pedestal includes three recesses which receive three horseshoes which can be varied in height with respect to an upper surface of the pedestal by mounting a shim beneath each horseshoe. The shim set includes shims of different thicknesses which can range from 0.04 inch to 0.08 inch. For example, the shim set can include groups of shims having at least 10, preferably at least 20 and more preferably at least 30 groups of shims having different thicknesses which vary by 0.0005 inch. In an exemplary embodiment, for use with a pedestal, the shim set can include groups of at least three shims having thicknesses, in inches, of 0.0465, 0.0470, 0.0475, 0.0480, 0.0485, 0.0490, 0.0495, 0.0500, 0.0505, 0.0510, 0.0515, 0.0520, 0.0525, 0.0530, 0.0535, 0.0540, 0.0545, 0.0550, 0.0555, 0.0560, 0.0565, 0.0570, 0.0575, 0.0580, 0.0585, 0.0590, 0.0595, 0.0600, 0.0605, 0.0610, and 0.0615. Thus, depending on the particular deposition process and temperature of the pedestal, a set of shims can be used to adjust the height of the horseshoes and thereby position the wafer with a predetermined gap (offset distance) between the wafer and carrier ring.

Within the vacuum chamber 324, the pedestal assembly 320 supports the substrate 316 on which materials may be deposited. The pedestal assembly 320 can be coupled with a heater block for heating the substrate 316 to a desired temperature. Generally, the substrate 316 is maintained at a temperature of about 25° C. to 500° C. depending on the material to be deposited. In a multi-station deposition apparatus, each station may heat the wafer to a different temperature and different thickness shims can be used to vary the offset distance appropriate for the processing conditions at each station.

Figure 2:
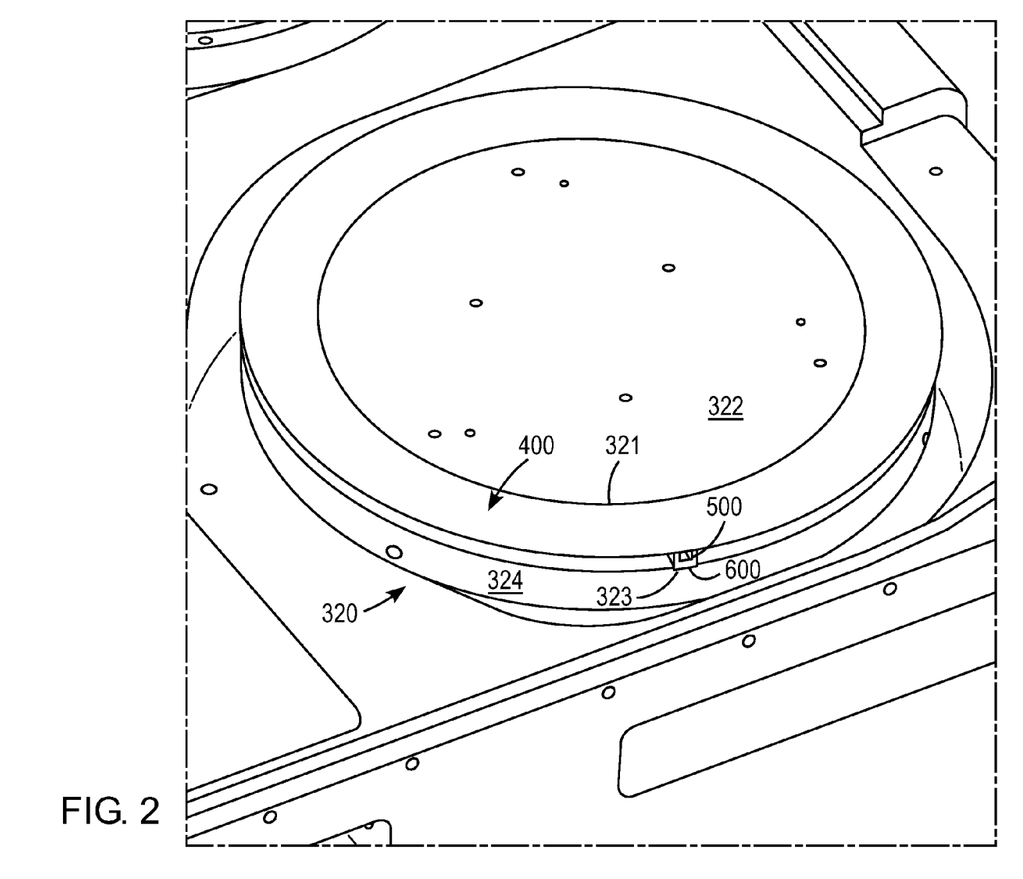
FIG. 2 is a perspective view of a pedestal assembly supporting a carrier ring on horseshoes and shims located around a periphery of the pedestal assembly.

FIG. 2 is a perspective view of a pedestal assembly 320 wherein a carrier ring 400 sits in an annular recess 321 extending into an upper surface 322 of the pedestal assembly 320. In a preferred embodiment, the pedestal assembly 320 includes three rectangular openings 323 extending into an outer periphery of a side wall 324 of the pedestal assembly 320 and three horseshoes 500 are located in the openings 323. Shims 600 are located beneath the horseshoes 500 to adjust the height of the horseshoes with respect to the upper surface 322 of the pedestal assembly 320.

Figure 3A:
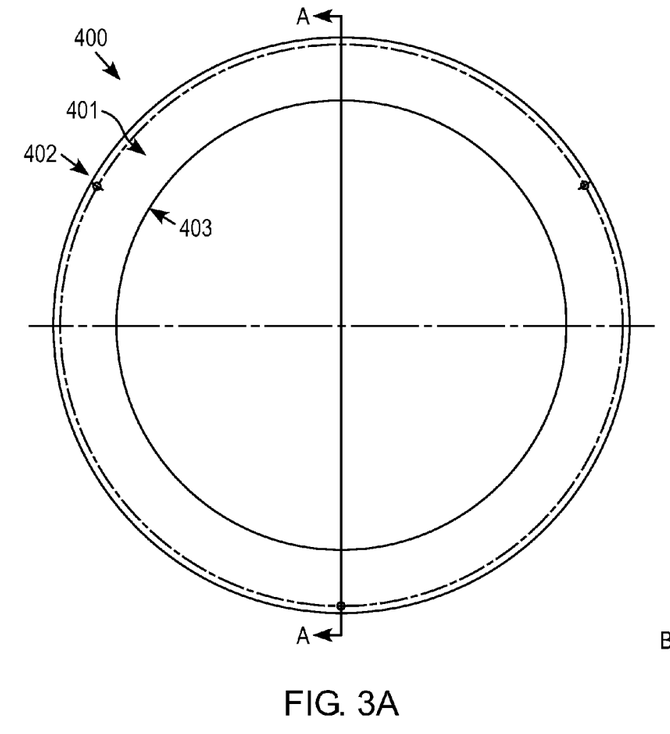
Figure 3B:
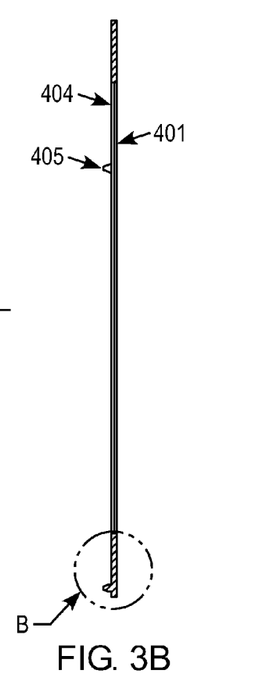
FIG. 3B is a side view of the carrier ring along the lines A-A in FIG. 3A.
Figure 3C:
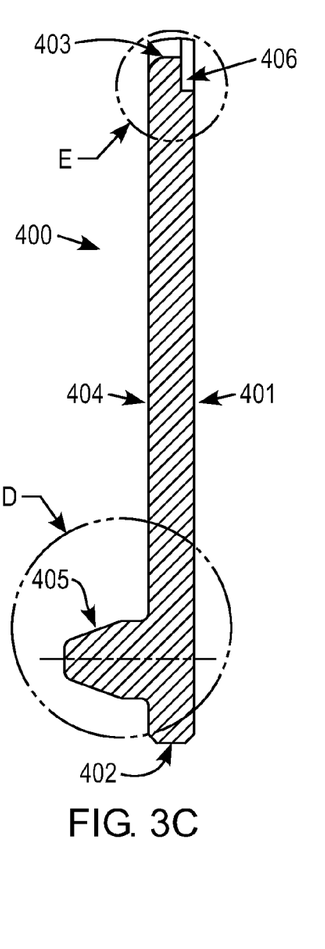
FIG. 3C is a cross-sectional view of Detail A in FIG. 3B.
Figure 3D:
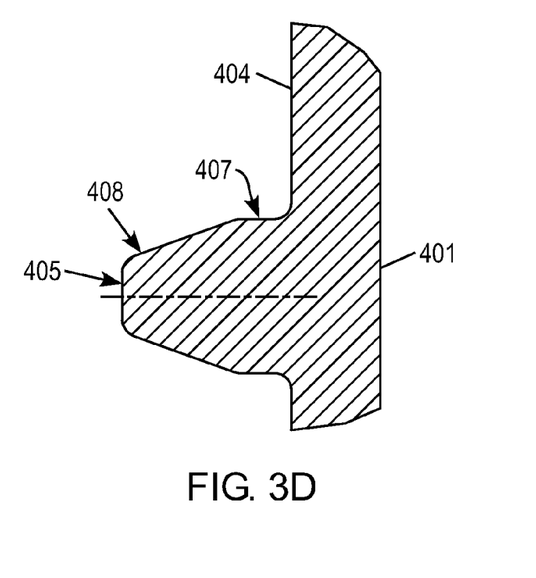
FIG. 3D is a cross-sectional view of Detail D in FIG. 3C.
Figure 3E:
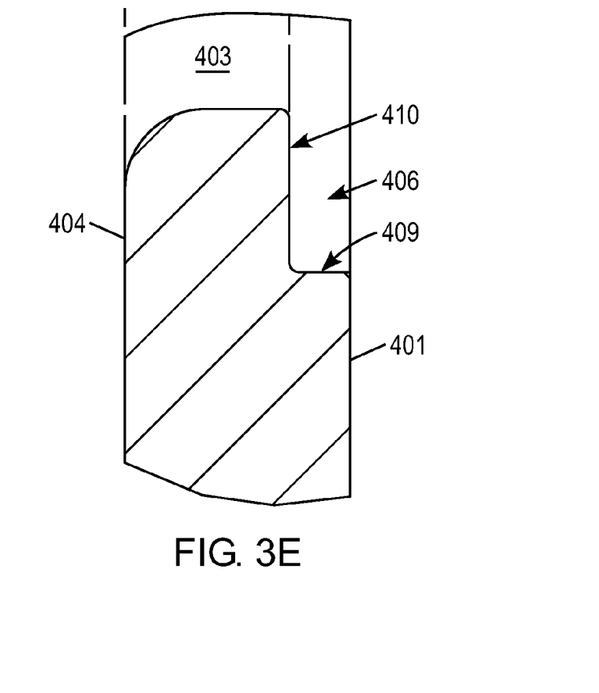
FIG. 3E is a cross-sectional view of Detail E in FIG. 3C.

FIGS. 3A-D illustrate a preferred embodiment of carrier ring 400. As shown in FIG. 3A, the carrier ring 400 includes an annular upper surface 401, an outer side wall 402 and an inner side wall 403. FIG. 3B shows a cross section of the carrier ring 400 along the lines A-A in FIG. 3A. As shown in FIG. 3B, the carrier ring 400 includes a lower surface 404 having a plurality of alignment pins 405 extending therefrom. FIG. 3C is a cross-section of the carrier ring 400 at detail B in FIG. 3B. As shown in FIG. 3C, the alignment pin 405 is located inward of outer side wall 402 and an annular recess 406 extends into the inner side wall 403 and into the upper surface 401. FIG. 3D is a cross-section of the carrier ring 400 at detail D in FIG. 3C and FIG. 3E is a cross-section of the carrier ring 400 at detail E in FIG. 3C. As shown in FIG. 3D, the alignment pin 405 includes a uniform diameter section 407 close to the lower surface 404 and a tapered section 408 at a free end of the alignment pin 405. As shown in FIG. 3E, the annular recess 406 is formed by a vertical wall 409 and a horizontal wall 410. The carrier ring preferably has an outer diameter of about 15 inches, an inner diameter of about 11.7 inches, a thickness of about 0.1 inch, three alignment pins, each of the alignment pins having a length of about 0.2 inch with a uniform diameter portion extending about 0.06 inch from the lower surface and a tapered portion extending to a free end of the alignment pin, and an annular recess extending into the inner wall and the upper surface, the annular recess formed by a vertical wall having a diameter of about 11.9 inches and extending about 0.03 inch from the upper surface and a horizontal wall extending about 0.08 inch from the inner wall.

Figure 4A:
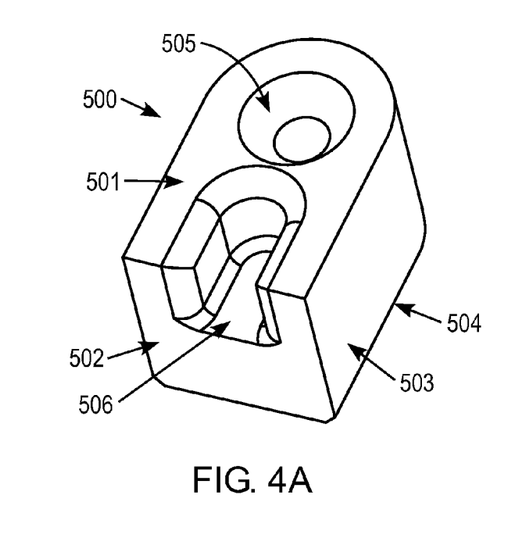
FIG. 4A is a perspective view of the horseshoe.
Figure 4B:
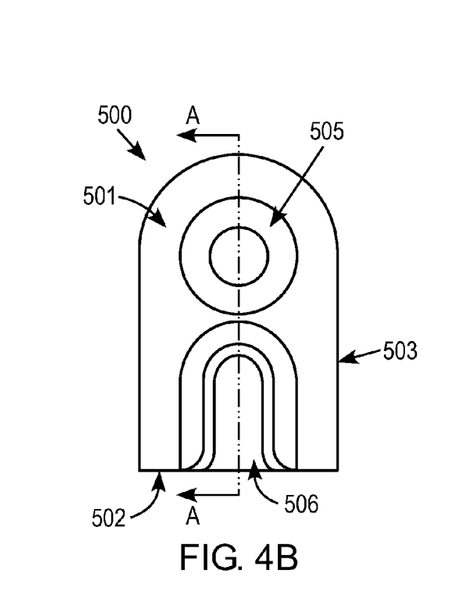
Figure 4C:
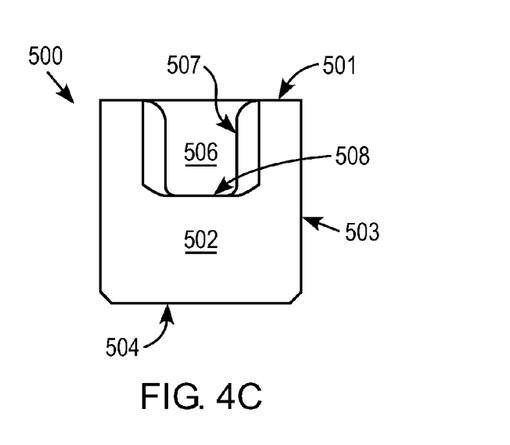
Figure 4D:
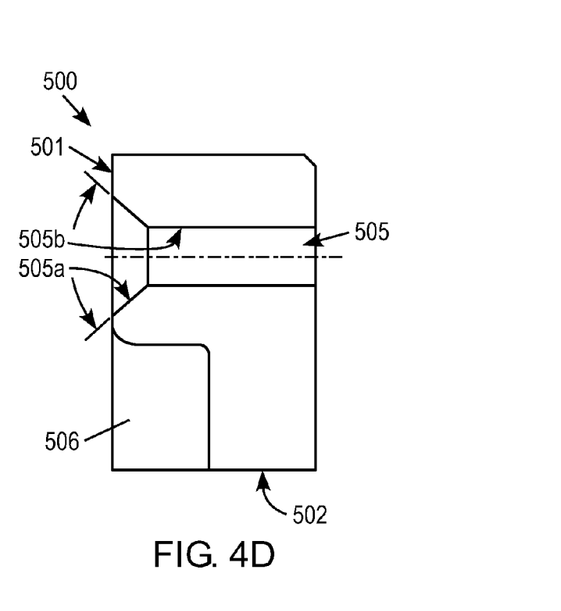
FIG. 4D is a cross-sectional view along the lines A-A in FIG. 4B.

FIGS. 4A-D show details of a preferred horseshoe 500. FIG. 4A is a perspective view of a horseshoe 500 having an upper surface 501, an end wall 502, side wall 503, bottom surface 504, bore 505 and slot 506. The side wall 504 has a pair of opposed straight sections connected by a curved section. The bore 505 extends from upper surface 501 to lower surface 504. The slot 506 opens on the end wall 502 and extends along about one-half of the upper surface 501. The bore 505 is located between the slot 506 and the curved section of side wall 504. FIG. 4B is a top view of horseshoe 500, FIG. 4C is an end view of horseshoe 500 and FIG. 4D is a cross-section of horseshoe taken along the lines A-A in FIG. 4B. As can be seen in FIG. 4C, slot 506 is formed by vertical wall 507 and horizontal wall 508 wherein vertical wall 507 includes a pair of short curved sections 507*a*, a pair of straight sections 507*b* and a curved section 507. As shown in FIG. 4D, the bore 505 includes a tapered section 505*a* and a uniform diameter section 505*b*. The horseshoe preferably has a length of about 0.8 inch, a width of about 0.5 inch, a thickness of about 0.5 inch, the bore having a diameter of about 0.15 inch, the slot having a width of about 0.19 inch and a height of about 0.25 inch, the bore aligned with the slot, the side wall having a pair of parallel straight sections connected by a semicircular section having a radius of about 0.26 inch measured from a center of the bore, the bore having a uniform diameter portion extending about 0.16 inch from the lower surface and a conical portion extending into the upper surface of the horseshoe, the conical portion forming a chamfer with an angle of about 80° and the slot having chamfered edges along the end wall and upper surface.

Figure 5A:
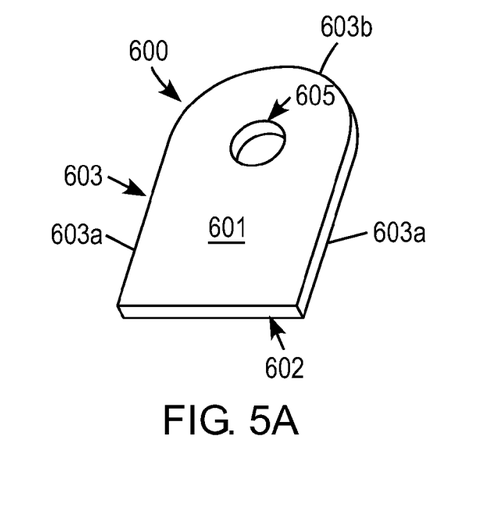
FIG. 5A is a perspective view of the shim.
Figure 5B:
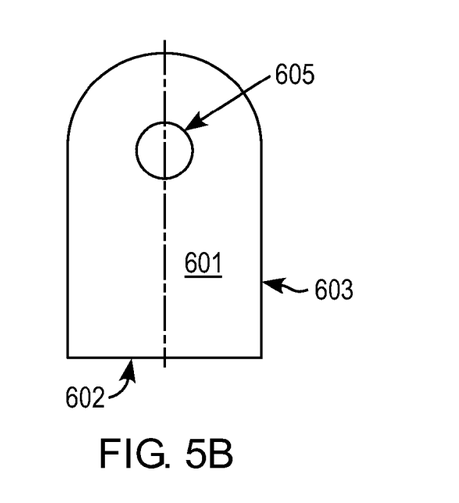
Figure 5C:
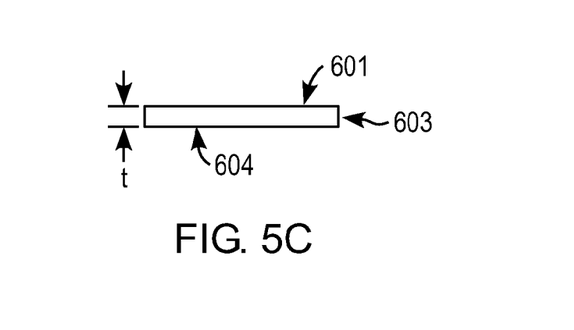
Figure 6:
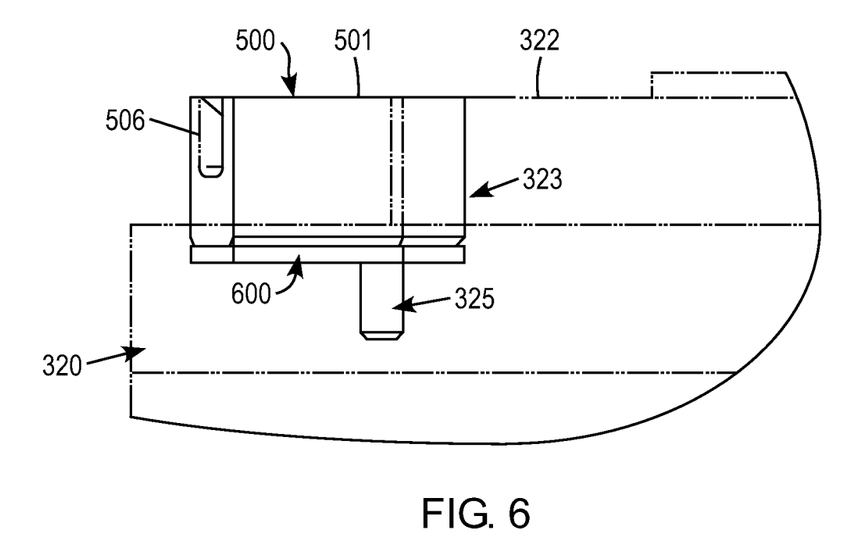
FIG. 6 is a perspective view of a pedestal assembly with a horseshoe and shim mounted on the pedestal assembly with a locating pin.

FIGS. 5A-C show details of a shim 600. FIG. 5A is a perspective view of a shim 600 having an upper surface 601, end wall 602, side wall 603, bottom surface 604 and bore 605 extending between the upper surface 601 and the lower surface 604. The upper surface 601 is parallel to the lower surface 604 and the side wall 603 includes a pair of parallel straight sections 603*a* connected by a curved section 603*b*. The bore 605 has the same diameter as the bore 505 of the horseshoes 500. The shims of the shim set have the same shapes and various thicknesses "t" between the upper surface 601 and the lower surface 604. The shim preferably has a length of about 0.8 inch, a width of about 0.5 inch, a bore having a diameter of about 0.15 inch, and a thickness of 0.0465 inch, 0.0470 inch, 0.0475 inch, 0.0480 inch, 0.0485 inch, 0.0490 inch, 0.0495 inch, 0.0500 inch, 0.0505 inch, 0.0510 inch, 0.0515 inch, 0.0520 inch, 0.0525 inch, 0.0530 inch, 0.0535 inch, 0.0540 inch, 0.0545 inch, 0.0550 inch, 0.0555 inch, 0.0560 inch, 0.0565 inch, 0.0570 inch, 0.0575 inch, 0.0580 inch, 0.0585 inch, 0.0590 inch, 0.0595 inch, 0.0600 inch, 0.0605 inch, 0.0610 inch, or 0.0615 inch FIG. 6 shows details of a horseshoe 500 and shim 600 mounted in a rectangular opening 323 of the pedestal assembly 320. As shown, the horseshoe and shim 600 are held in the opening 323 by a locating pin 325 which extends through the bore 605 in shim 600 and into the bore 505 of horseshoe 500. By using a shim with desired thickness "t" it is possible to locate the upper surface 501 with a desired offset with respect to upper surface 322 of the pedestal assembly 320.

A process tuning kit (PTK) preferably includes a set of shims configured to locate carrier ring 400 with a desired offset distance with respect to upper surface 322 of the pedestal assembly 320. In a multi-station processing apparatus such as a system wherein four carrier rings are mounted on four pedestal assemblies located inside a vacuum chamber and wafers are sequentially processed at each station, each pedestal assembly can be provided with shims having a predetermined thickness selected to reduce backside deposition on the substrate. Thus, it is possible to use identical sets of horseshoes in each pedestal assembly and adjust their heights with the shim set.

The carrier ring 400 can have different inner diameters to achieve desired processing effects. For example, to change the degree of backside deposition, it may be desired to reduce the inner diameter of the inner side wall 403 to provide a desired gap between the underside of a wafer and the annular recess 406 of the carrier ring 400. Variations of the inner diameter of the carrier ring 400 on the order of thousandths of an inch can contribute to reduction in backside deposition.

The materials used for the carrier rings, horseshoes and shims are preferably ceramic material having suitable purity such as 99.5% or higher purity suitable for semiconductor processing. The carrier rings, horseshoes and shims are preferably made of high purity aluminum oxide made by any suitable technique. For example, as starting materials, a high-purity alumina powder and small amounts of $MgCO_3$, $CaCO_3$, and $SiO_2$ powders, which serve as sintering aids during firing, can be mixed and subjected to wet grinding to thereby obtain a slurry and an organic binder can be added to the slurry, and mixing is performed, followed by spray drying to form alumina granules.

To manufacture the carrier ring, the alumina granules can be formed into a shaped body with an outer diameter of about 15 inches, an inner diameter of about 11.7 inches, and a thickness of about 0.1 inch with three alignment pins about 0.2 inch long. The resulting shaped body can be machined if needed and fired in the air at 1,550° C. to 1,650° C. to form a sintered body. The resulting sintered body can be subjected to heat treatment by hot isostatic pressing (HIP) in Ar gas, at a temperature lower than the firing temperature and in a range of 1,500° C. to 1,600° C., and at 200 MPa. Thereby, a dense alumina body is formed. The resulting dense alumina body can be annealed for at least five minutes in the air, at a temperature lower than the heat treatment temperature by HIP and in a range of 1,400° C. to 1,550° C. The temperature-lowering rate from the temperature during hot isostatic pressing to the annealing temperature after hot isostatic pressing is set low at less than 1.0° C./hour. For example, the temperature-lowering rate can be set at 0.6° C./hour. After annealing is performed, both main surfaces can be polished with any suitable equipment such as a diamond-electrodeposited grindstone using a rotary grinder. Thereby, a carrier ring can be obtained. Using a laser beam machine, the resulting carrier ring can be machined so as to have exact dimensions, and surface roughness.

To manufacture the horseshoe, the alumina granules can be formed into a shaped body about 0.825 inch long, about 0.525 inch wide and about 0.53 inch thick. The resulting shaped body can be machined to form the bore with a diameter of about 0.15 inch with a taper of about 80° at the upper surface and the slot can be formed with a depth of about 0.25 inch, a width of about 0.2 inch and length of about 0.3 inch and processed as described above for the carrier ring. After the sintering and annealing treatments are performed, the exposed surfaces can be polished with any suitable equipment such as a diamond-electrodeposited grindstone using a rotary grinder. Thereby, a horseshoe can be obtained. Using a laser beam machine, the resulting horseshoe can be machined so as to have exact dimensions, and surface roughness.

To manufacture the shim, the alumina granules can be formed into a shaped body about 0.825 inch long, about 0.525 inch wide and about 0.05 to 0.06 inch thick. The resulting shaped body can be machined to form the bore with a diameter of about 0.15 inch and processed as described above for the carrier ring. After the sintering and annealing treatments are performed, the exposed surfaces can be polished with any suitable equipment such as a diamond-electrodeposited grindstone using a rotary grinder. Thereby, a shim can be obtained. Using a laser beam machine, the resulting shim can be machined so as to have exact dimensions, and surface roughness.

Also disclosed herein is a method of processing a semiconductor substrate in a processing apparatus. The method comprises supplying reactor chemistries from the reactor chemistries source into the deposition chamber, and processing a semiconductor substrate in the plasma processing chamber. The method preferably comprises plasma processing the substrate wherein RF energy is applied to the reactor chemistries using an RF generator which generates the plasma in the deposition chamber.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

While the plasma processing apparatus including an isothermal deposition chamber has been described in detail with reference to specific embodiments thereof, it will be apparent to those skilled in the art that various changes and modifications can be made, and equivalents employed, without departing from the scope of the appended claims.

What is claimed is:

1. A process tuning kit useful in a chemical deposition apparatus, the kit comprising a carrier ring, set of three horseshoes and sets of three shims wherein:

each of the shims has an upper surface, a lower surface parallel to the upper surface, an end wall, a U-shaped sidewall extending from the end wall and a bore of the shim extending between the upper and lower surfaces, a first set of three shims having the same thickness and a second set of the shims having a different thickness than the first set of shims;

each of the horseshoes has an upper surface, a lower surface parallel to the upper surface, an end wall, a U-shaped side wall extending from the end wall, a bore of the horseshoe extending between the upper and lower surfaces, and a slot opening in the end wall and extending less than half way across the upper surface, the bore of the horseshoe having the same diameter as the bore of the shims;

the carrier ring having an upper surface, a lower surface parallel to the upper surface, an outer side wall, an inner side wall, and three alignment pins extending from the lower surface.

2. The kit of claim 1, wherein the shims include at least ten sets having different thicknesses.

3. The kit of claim 1, wherein the bore of the horseshoe is tapered outwardly an upper end of the bore of the horseshoe.

4. The kit of claim 1, wherein the carrier ring, horseshoes and shims are made of high purity alumina.

5. The kit of claim 1, wherein the horseshoe has a length of about 0.8 inch, a width of about 0.5 inch, a thickness of about 0.5 inch, the bore of the horseshoe having a diameter of about 0.15 inch, the slot having a width of about 0.19 inch and a height of about 0.25 inch, the bore of the horseshoe aligned with the slot, the side wall having a pair of parallel straight sections connected by a semicircular section having a radius of about 0.26 inch measured from a center of the bore of the horseshoe, the bore of the horseshoe having a uniform diameter portion extending about 0.16 inch from the lower surface and a conical portion extending into the upper surface of the horseshoe, the conical portion forming a chamfer with an angle of about 80° and the slot having chamfered edges along the end wall and upper surface.

6. The kit of claim 1, wherein the shim has a length of about 0.8 inch, a width of about 0.5 inch, the bore of the shim having a diameter of about 0.15 inch, and a thickness of 0.0465 inch, 0.0470 inch, 0.0475 inch, 0.0480 inch, 0.0485 inch, 0.0490 inch, 0.0495 inch, 0.0500 inch, 0.0505 inch, 0.0510 inch, 0.0515 inch, 0.0520 inch, 0.0525 inch, 0.0530 inch, 0.0535 inch, 0.0540 inch, 0.0545 inch, 0.0550 inch, 0.0555 inch, 0.0560 inch, 0.0565 inch, 0.0570 inch, 0.0575 inch, 0.0580 inch, 0.0585 inch, 0.0590 inch, 0.0595 inch, 0.0600 inch, 0.0605 inch, 0.0610 inch, or 0.0615 inch.

7. The kit of claim 1, wherein the carrier ring has an outer diameter of about 15 inches, an inner diameter of about 11.7 inches, a thickness of about 0.1 inch, each of the three alignment pins having a length of about 0.2 inch with a uniform diameter portion extending about 0.06 inch from the lower surface and a tapered portion extending to a free end of the alignment pin, and an annular recess extending into the inner wall and the upper surface, the annular recess formed by a vertical wall having a diameter of about 11.9 inches and extending about 0.03 inch from the upper surface and a horizontal wall extending about 0.08 inch from the inner wall.

8. A pedestal assembly comprising the kit of claim 1, wherein the pedestal assembly includes three rectangular openings in which the shims underlie the horseshoes and the carrier ring is supported on the horseshoes.

9. The pedestal assembly of claim 8, wherein the pedestal assembly includes locating pins, the locating pins extending through the bores of the shims and part way through the bores of the horseshoes, the alignment pins of the carrier ring extending into the bores of the horseshoes.

10. A method of processing a semiconductor substrate in a chemical deposition apparatus, comprising:
    transporting the substrate on a ceramic carrier ring into a vacuum chamber of the chemical deposition apparatus and placing the carrier ring on a pedestal assembly having a set of ceramic horseshoe and ceramic shims of a process tuning kit according to claim 1 which support the carrier ring, the horseshoes having bores which receive alignment pins extending from a lower surface of the carrier ring, the substrate being lifted off the carrier ring by minimum contact area supports on the pedestal assembly such that an underside of the substrate is located a predetermined offset distance form an upper surface of the carrier ring;
    depositing a layer of material on the substrate while heating the substrate and maintaining the predetermined offset distance such that backside deposition on the substrate is minimized.

11. The method of claim 10, wherein the pedestal assembly includes an annular recess and three rectangular openings which extend into an outer periphery of the pedestal assembly and open into the annular recess, each of the rectangular openings having a shim and horseshoe mounted therein with a locating pin on the pedestal assembly extending through bores of the shims and part way through bores of the horseshoes, each of the shims having the same thickness and providing the predetermined offset distance which limits backside deposition to 50 Å or less at 3 mm from a bevel edge of the substrate.

\* \* \* \* \*